United States Patent [19]

Sanger

[11] 4,229,765
[45] Oct. 21, 1980

[54] REMOTE AUDIO AND BRIGHTNESS CONTROL CIRCUIT FOR TELEVISION

[76] Inventor: Winston D. Sanger, 12600 Cuddy Valley Rd., Frazier Park, Calif. 93225

[21] Appl. No.: 1,220

[22] Filed: Jan. 5, 1979

[51] Int. Cl.³ .............................................. H04N 5/44
[52] U.S. Cl. ................................. 358/188; 358/194.1; 358/165; 358/168; 358/198
[58] Field of Search ............... 358/188, 189, 194, 198, 358/168, 165; 325/389, 390, 391, 392, 393, 395

[56] References Cited

U.S. PATENT DOCUMENTS

| 3,018,330 | 1/1962 | Soja | 358/189 |
| 3,266,021 | 8/1966 | Druz et al. | 358/194 X |

*Primary Examiner*—Robert L. Richardson

[57] ABSTRACT

A remote control switching circuit is provided for enabling a person watching and listening to television to edit out unwanted portions of a television program. Thus, while watching television, when an unwanted portion appears, the watcher uses a remote control device for actuating switches which provide for replacing the audio of the television set with the audio of an alternate sound source and for simultaneously dimming the picture on the tube of the television set so that it is only faintly discernible. Then, by viewing the picture tube, the watcher can see by observing the faint image on the screen when to use the remote control device to again actuate, i.e., reverse, the switches for returning to the audio of the program of the television set in place of the audio of the alternate source and for simultaneously brightening the picture on the tube for normal viewing.

7 Claims, 3 Drawing Figures

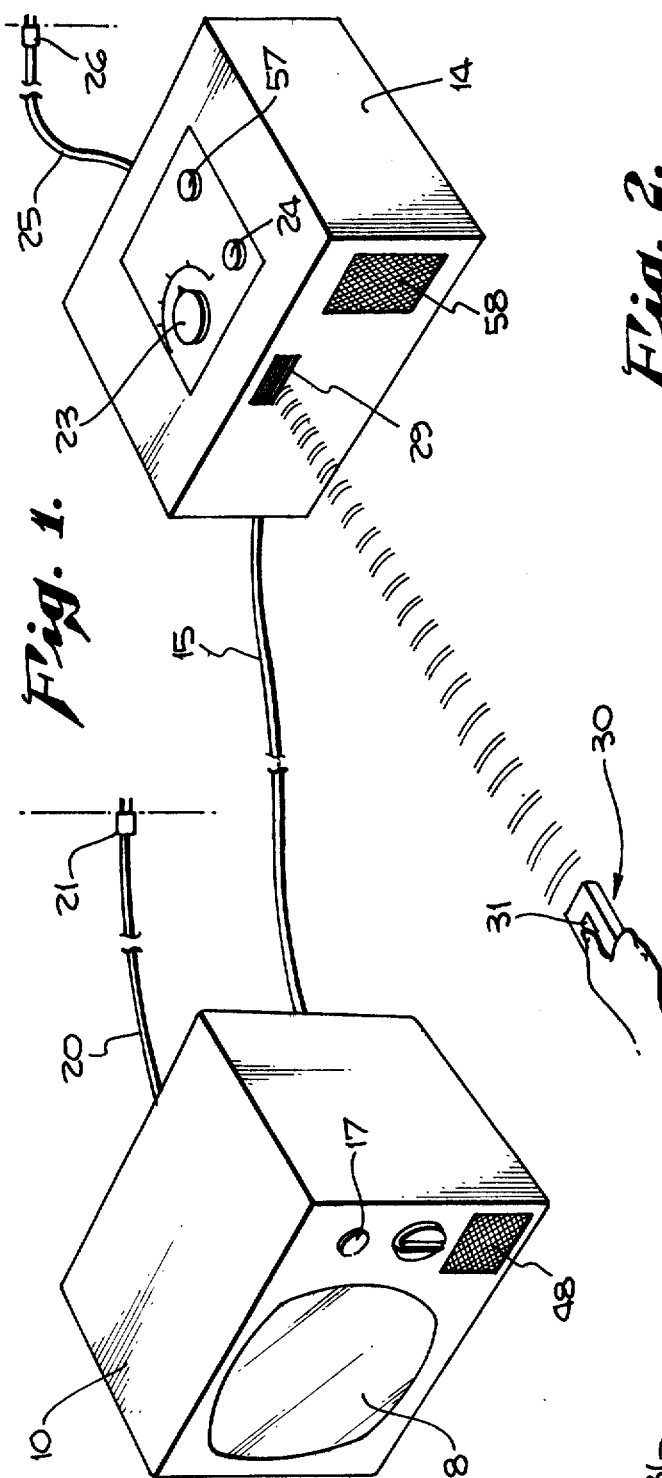
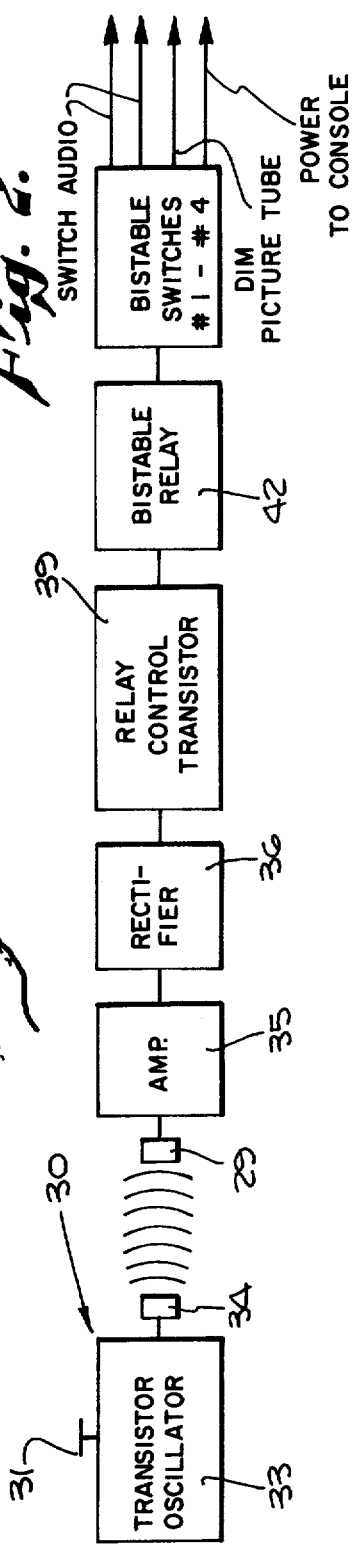

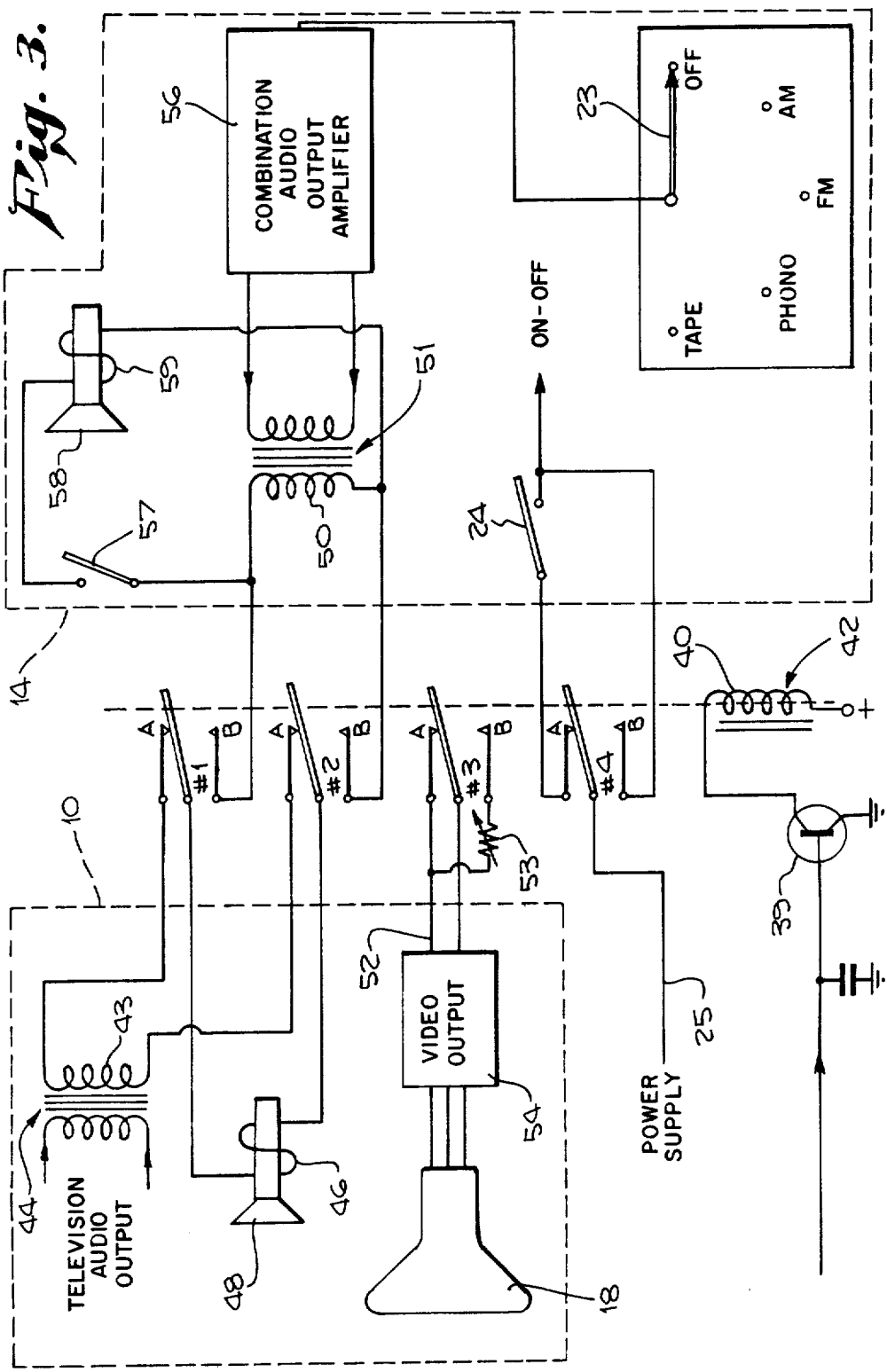

REMOTE AUDIO AND BRIGHTNESS CONTROL CIRCUIT FOR TELEVISION

BACKGROUND AND SUMMARY OF THE INVENTION

This invention relates to television and more particularly to a remote control circuit for controlling the audio and video outputs of a television set by editing out unwanted portions of a broadcast.

Persons who spend a lot of time watching and listening to television are often bothered by portions of the audio and video being received. This is particularly aggravating when the same unwanted portions of the television audio and video are repeatedly presented over extended periods of time.

It is thus seen that it is highly desirable for a watcher of television to be able to eliminate the boring sound portions of such television programs by substituting therefor the audio of an alternate sound system such as a radio, phonograph or a tape player, and by simultaneously dimming the video picture.

In accordance with the present invention, while watching television, when television signals are broadcast which a person does not want to observe or hear on his television set, he employs a remote control circuit to simultaneously switch off the television audio sound, switch the brightness control circuit for the picture tube to dim the picture such that it is barely visually discernible, switch the power to an alternate sound source, and switch the audio output of the alternate sound source to the television loudspeaker in place of the audio output of the television set. Then, when the television watcher notices by observing the dimmed picture tube that the unwanted portion is over and the desired program is to resume, he employs the remote control circuit to simultaneously switch off the power to the alternate sound system, switch the audio output of the television set back to its loudspeaker, and switch the brightness control circuit on the picture tube so that the picture is returned to its normal viewing level.

It is, accordingly, an object of the present invention to provide a remote control circuit for editing out unwanted portions of a television program and substituting therefor the audio of an alternate sound system.

Another object of the present invention is to provide a switching circuit responsive to a first depressing of a button on a remote control device for substituting the audio of an alternate sound system for the audio of the television set and dimming the picture on the picture tube thereof; and responsive to a second depressing of the button on the remote control device for returning the audio of the television set back to its desired program and brightening the picture tube back to its normal level for viewing.

Additional features and objects of the invention will be presented in connection with the ensuing detailed description of the drawings.

BRIEF DESCRIPTION OF THE DRAWINGS

FIG. 1 is a pictorial view illustrating a remote control device for controlling the operation of a television set and a combination alternate sound system in accordance with the present invention;

FIG. 2 is an overall block diagram of the remote control circuit of the present invention; and FIG. 3 shows a schematic diagram of a relay control circuit for controlling the action of the switches for performing the switching functions of the present invention.

DESCRIPTION OF THE PREFERRED EMBODIMENT

Referring to FIG. 1, a television set 10 and a combination sound console 14 are shown connected together by a cable 15. The television set 10 is provided with an electric cord 20 having a wall plug 21, an on-off switch 17, a picture tube 18, and a loudspeaker 48. The combination sound console 14 is provided with an electric cord 25 having a wall plug 26, a manual on-off switch 24, and at least one loudspeaker 58. The combination sound console 14 may include an A.M. radio, an F.M. radio, a phonograph, and a tape player and/or any combination thereof, any of which can be selected by manual switch 23 to be played through the common audio output amplifier 56 (FIG. 3) and loudspeaker 58 provided in the console 14.

A pickup microphone 29 is mounted on the front wall of the combination sound console 14. The pickup microphone 29 is responsive to an ultrasonic signal transmitted by a remote control device 30 shown held in the hand of the television watcher so as to be pointed towards the console 14. The remote control device 30 has a single button 31 which provides an ultrasonic signal each time it is manually depressed. The pickup microphone 29 converts the ultrasonic signal it receives into an electrical control signal for controlling switches #1 to #4, inclusive, (FIG. 3) provided in the combination sound console 14. The switches #1 to #4, inclusive, perform the desired switching functions of the present invention.

Shown in FIG. 2 is a block diagram of the remote control switching circuit of the present invention. The circuit includes a remote transmitter comprising a battery powered transistor oscillator 33 and a suitable transducer 34 enclosed in the remote control device 30. The remote control device 30 provides for the transmitting of an ultrasonic signal having a fixed frequency on the order of 40 k.c. each time its control button 31 is depressed. The ultrasonic signal is picked up by a receiver comprising the pickup microphone 29, an amplifier 35, and a rectifier 36. The pickup microphone 29 which may be in the form of a resonant ceramic transducer is mounted in an opening on the front wall of the combination sound console 14. The ultrasonic signal sensed by the pickup microphone 29 is converted into an electrical signal which is amplified in the amplifier 35 and rectified or otherwise shaped in the rectifier 36 to provide an electrical control signal on the base of a relay control transistor 39. As shown in FIG. 3, the collector-emitter path of transistor 39 conducts in response to the electrical control signal on its base to energize the coil 40 of a bistable relay 42 which actuates the four switches #1, #2, #3, and #4, each of which is a single-pole, double-throw switch. The bistable relay 42 moves the switches to their alternate position each time its coil 40 is energized. Thus, the switches #1 to #4, inclusive, are simultaneously moved from switch position A to switch position B in response to one depression of the control button 31 on the remote control device 30, and are simultaneously moved from position B back to position A in response to the next depression of the same control button 31.

It should be understood that relay 42 is of the bistable or latching type in that it includes a mechanism (not shown) which provides for latching the switches #1, #2, #3, and #4 in either position A or position B until the button 31 on the remote control device 30 is again depressed sending out an ultrasonic signal causing the bistable relay 42 to change switch positions.

Referring to the schematic diagram in FIG. 3, the television set 10 is shown to include the loudspeaker 48, an audio output transformer 44, and the picture tube 18 fed by a video output 54. The combination sound console 14 is shown to include the loudspeaker 58 and an audio output transformer 51 fed by the audio output amplifier 56. As previously described, the audio output amplifier 56 can receive its audio input from either an A.M. radio, a F.M. radio, a phonograph or a tape player as manually selected by switch 23. It should be noted that the combination sound console 14 can be operated in any of its modes, independent of the television set.

The contacts of switches #1 to #4, inclusive, provide for interconnecting and controlling the television set 10 and the combination sound console 14 to operate in accordance with the present invention. Thus, when the poles of switches #1 and #2 are in position A, they provide for connecting the respective terminals of the secondary winding 43 of the television audio output transformer 44 across the terminals of the voice coil 46 of the television loudspeaker 48. When the pole of switch #3 is in position A, it provides for directly connecting the terminals of the brightness control circuit 52 so that the picture of the television tube has its normal viewing brightness. When the pole of switch #4 is in position A, it provides for connecting the power supply cord 25 to the combination sound console 14 via manual on-off switch 24 which is in its off position when the television set 10 is turned on for viewing.

It should now be clear from FIG. 3, that when the poles of switches #1 and #2 are switched from position A to position B, they operate to disconnect the secondary winding 43 of the television audio transformer 44 from across the voice coil 46 of the television loudspeaker 48 and connect in its place the secondary winding 50 of the audio transformer 51 in the combination sound console 14. When the pole of switch #3 is switched from position A to position B, it operates to insert a resistor 53 in the brightness control circuit 52 of the video output 54 of the television set 10 causing the picture tube 18 thereof to be dimmed such that the picture can be just barely made out. The resistor 53 may be variable so that the dimness of the picture tube 18 can be controlled. When the pole of switch #4 is switched from position A to position B, it operates to bypass the manual on-off switch 24 and connect the power on cord 25 directly to the combination sound console 14 to turn it on.

While watching television, with the use of the remote control circuit of the present invention, both the television set 10 and the combination sound console 14 have their respective wall plugs 21 and 26 connected to receive power. However, only the television set 10 has its on-off switch 17 in the on position, the combination sound console 14 being left with its manual on-off switch in the off position. In addition, the relay switches #1 to #4, inclusive, are initially all in position A. Thus, the television set 10 operates in a normal manner with its loudspeaker 48 receiving the audio output of the scheduled broadcast program and with its picture tube 18 set at its normal brightness for viewing.

During the course of watching the television set 10, when an undesirable portion of a program appears on the picture tube 18 which the watcher does not want to receive, he presses the button 31 on the remote control device 30, thereby causing the poles of switches #1, #2, #3, and #4 to switch to their opposite position B. Thus, switches #1 and #2 are switched to position B to provide for disconnecting the secondary winding 43 of the output transformer 44 of the television set 10 and connecting instead the secondary winding 50 of the output transformer 51 of the combination sound console 14 across the voice coil 46 of the television loudspeaker 48 so as to provide therefrom the sound of the audio output of the combination sound console 14. At the same time, switch #3 is switched to position B to insert the resistor 53 of sufficient value across the brightness control circuit 52 of the video output 54 so as to dim the picture on the tube 18 to a desired low level. Simultaneously, switch #4 is switched to position B to furnish power to the combination sound console 14 so that all of its circuits and/or motors may operate as selected. Thus, in place of the undesirable portion of a program on the television set, the television watcher can enjoy music, for example, of the combination sound console 14 through the loudspeaker 48 of the television set.

Now then, by observing the picture on the dimmed picture tube 18, the watcher can determine when the undesirable portion of the television program is over and by again merely pressing the button 31 on the remote control device 30 he can simultaneously return switch #4 back to its position A to cut off the power to the combination sound console 14, return switches #1 and #2 back to position A to connect the audio of the television set back to its television loudspeaker 48, and return switch #3 back to its position A to again brighten the picture on the picture tube for normal viewing.

It should be understood that instead of providing for enclosing the receiver including microphone 29 and the relay switches #1 to #4, inclusive, in the combination sound console 14, it is within the scope of this invention to enclose these components in the television set 10 or in a separate box having leads running to the appropriate terminals of the television set 10 and the combination sound console 14, as schematically illustrated in FIG. 3, to perform the desired switching functions.

An additional manual switch 57 can be placed in the circuit of the loudspeaker 58 of the combination sound console 14 to control the connecting of the secondary winding 50 of the output transformer 51 across the voice coil 59. Thus, with the manual switch 57 open, no sound will be produced by the loudspeaker 58 of the combination sound console 14 when the remote control switches #1 to #4, inclusive, are in position B.

When the television set 10 is turned off by use of its on-off switch 17, and the combination sound console 14 is turned on by use of its manual on-off switch 24, the console 14 can be played by itself in any of its selected modes irrespective of which position A or B the relay switches are in.

While the invention has been concerned with a particular embodiment of the present invention, it is to be understood that many modifications and variations in the construction and arrangement thereof may be provided for without departing from the spirit and scope of the invention or sacrificing any of its advantages. The invention is therefore considered as including all such modifications and variations coming within the legitimate and valid scope of the appended claims.

What is claimed is:

1. A switching system for television comprising:

a television set having an audio output and a picture tube with an adjustable brightness control circuit;

an alternate sound system having an audio output; and bistable switching means having contacts connected to the audio output and the brightness control circuit of said television set and the audio output of said alternate sound system;

whereby, while said television set is turned on for viewing, said switching means provides for eliminating undesired portions of a broadcast by switching the audio output of said alternate sound system in place of the audio output of said television set, and switching the brightness control circuit of the picture tube so that the picture thereon is just barely discernible.

2. A remote control switching system as defined in claim 1 wherein said bistable switching means includes a remote control device having a button which provides for reversing said switching means on each depression thereof.

3. A remote control switching circuit for television comprising:

a television set having an audio output and a picture tube with an adjustable brightness control circuit;

an alternate sound system having an audio output; and remotely controlled bistable switching means having contacts connected to the audio output and the brightness control circuit of said television set and the audio output of said alternate sound system;

whereby when an undesirable portion of a program is being received on said television set a viewer can actuate said bistable switching means to switch the audio output of said alternate sound system in place of the audio output of the television set and adjust the brightness control circuit to dim the picture on the picture tube; and whereby when the viewer notices by observing the picture tube that the desired program is to resume he can again actuate the bistable switching means to switch back to the audio output of the television set and adjust the brightness control circuit to brighten the picture tube for normal viewing.

4. A remote control circuit comprising:

a television set having an audio output, a loudspeaker, and a picture tube with an adjustable brightness control circuit;

an alternate sound system having a power input and an audio output;

bistable switching circuit means having contacts connected to the audio output and the brightness control circuit of said television set and the audio output and power input of said alternate sound system; and a remote control device for actuating said bistable switching circuit means;

whereby when an undesirable portion of a program is received on said television set a viewer can use said remote control device to actuate said bistable switching circuit means to switch power to the power input of said alternate sound system, switch the audio output of said alternate sound system of the loudspeaker of said television set in place of its audio output, and switch the adjustment of the brightness control circuit so that the picture tube is just barely discernible; and whereby when the viewer notices by observing the picture tube that the desired portion of the program is to resume he can use the remote control device to actuate said bistable switching circuit means to switch off the power to said alternate sound system, switch the audio output of said television set back to its loudspeaker, and switch the adjustment of the brightness control circuit so that the picture on the picture tube is again at its normal brightness for viewing.

5. A remote control circuit for a television set having a loudspeaker, an audio output transformer, and a picture tube with an adjustable brightness control circuit, and an alternate sound system having a power input and an audio output transformer, said circuit comprising:

a remote transmitter including a hand held remote control device having a button for radiating a signal when depressed; and a receiver including a pickup microphone and a bistable relay for operating first, second, third, and fourth single-pole double-throw switches, said pickup microphone sensing the signal radiated by said remote control device for actuating said bistable relay to reverse the settings of said switches;

said first and second single-pole double-throw switches selectively connected for switching the audio output transformer of said alternate sound system and the audio output transformer of said television set to said television loudspeaker;

said third single-pole double-throw switch selectively connected for adjusting the brightness control circuit of the picture tube to dim the picture thereon when said first and second single-pole double-throw switches are conditioned to connect the audio output of said alternate sound system to the television loudspeaker; and said fourth single-pole double-throw switch selectively connected for supplying power to turn on said alternate sound system when said first and second single-pole double-throw switches are conditioned to connect the audio output of said alternate sound system to the television loudspeaker.

6. A switching system for television comprising:

a television set having an audio output;

an alternate sound system having an audio output; and bistable switching means having contacts connected to said television set and said alternate sound system;

whereby, while said television set is turned on for viewing the video, said switching means provides for eliminating undesired accompanying audio portions of the broadcast by switching the audio output of said alternate sound system in place of the audio output of said television set.

7. A remote control circuit for television comprising:

a television set including an audio output, a loudspeaker having an input, and a picture tube having an adjustable brightness control circuit;

an alternate sound system having a power input and an audio output;

bistable switching means including first switch means for selectively connecting the input of said loudspeaker to the audio output of said television set and the audio output of said alternate sound system;

second switch means simultaneously operable with said first switch means for selectively adjusting the brightness control circuit to dim the picture on the picture tube when said first switch means is conditioned to connect the audio output of said alternate sound system to the input of said loudspeaker; and third switch means simultaneously operable with said first switch means for selectively applying power to energize said alternate sound system when said first switch means is conditioned to connect the audio output of said alternate sound system to the input of said loudspeaker; and a remote control device for actuating said bistable switching means.

* * * * *